United States Patent [19]

Takigawa

[11] 4,321,510

[45] Mar. 23, 1982

[54] ELECTRON BEAM SYSTEM

[75] Inventor: Tadahiro Takigawa, Inagi, Japan

[73] Assignee: Tokyo Shibaura Denki Kabushiki Kaisha, Kawasaki, Japan

[21] Appl. No.: 180,439

[22] Filed: Aug. 22, 1980

[30] Foreign Application Priority Data

Aug. 24, 1979 [JP] Japan .................................. 54-107168

[51] Int. Cl.³ ............................................ H01J 29/58
[52] U.S. Cl. .................................. 315/382; 315/367; 315/369; 250/397
[58] Field of Search ............... 315/382, 383, 367, 369, 315/17; 250/311, 396 ML, 397

[56] References Cited

PUBLICATIONS

S. Doran et al., J. Vac. Sci. Technol., Automatic Stabilization of an Electron Probe forming System, vol. 12, No. 6, Nov./Dec. 75., pp. 1174–1176.
J. L. Mauer et al., IBM J. Res. Develop., Electron Optics of an Electron Beam Lithographic System, Nov. 77, pp. 514–521.

Primary Examiner—Theodore M. Blum
Attorney, Agent, or Firm—Oblon, Fisher, Spivak, McClelland & Maier

[57] ABSTRACT

An electron source section including a first detecting sub-section and a first control sub-section and an image formation section including a second detecting sub-section and a second control sub-section are arranged in series. The first detecting sub-section detects at least one of the shape, diameter, brightness and spatial position of a crossover image formed by the electron source section to become an electron source of the image formation section and the direction of emission of the electron beam emitted from such crossover image, thereby to control the first control sub-section. The second detecting sub-section detects at least one of the shape and size of an electron beam image formed on a subject to be irradiated by the beam, and the current of the electron beam forming the electron beam image, thereby to control the second control sub-section.

7 Claims, 6 Drawing Figures

ELECTRON BEAM SYSTEM

BACKGROUND OF THE INVENTION

This invention relates to an electron beam system and particularly to an electron beam projection system for an electron beam exposure system.

In an electron beam exposure system for projecting to a sample a circular Gaussian beam, namely, a crossover image, image formation is made with large-diameter beams when no precision is required therefor and is made with small-diameter beams when high precision is required therefor. Further, it is demanded that a desired beam diameter is obtained by changing the diameter of a beam in units of, for example, 0.1 μm with the brightness thereof kept fixed, thereby to increase the yield of masks on which images are formed. Further, it is also demanded that the beam diameter, beam current and beam shape (for example, the degree of beam circle) are precisely controlled for the purpose of increasing the precision of the image pattern formed on the sample.

Figure 1:
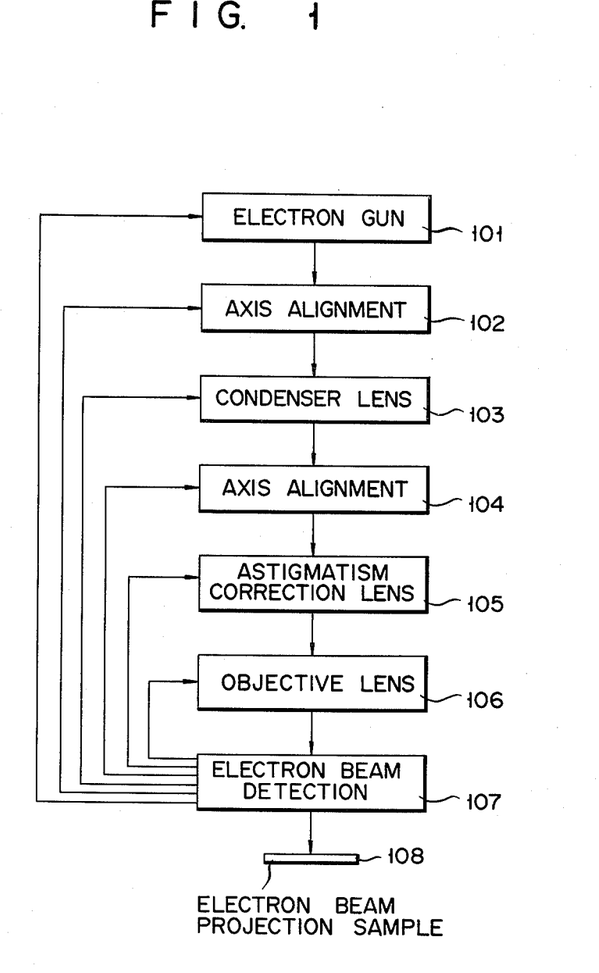
FIG. 1 is a block diagram showing a conventional electron beam system.

In order to give a better understanding of the electron beam system we will hereinbelow explain the method of controlling the beam current, beam diameter, and beam shape which is obtained for a conventional electron beam system, by reference to FIG. 1. In the FIGURE, 101 denotes an electron gun, 102 an axis-alignment device for the electron beam from the electron gun 101, 103 a condenser lens for converging the electron beam, 104 an axis-alignment device for the electron beam which has passed through the condenser lens 103, 105 an astigmatism correction lens for correcting the astigmatism of the lens, 106 an objective lens, and 107 an electron beam detection device. A sample 108 onto which an electron beam is irradiated is arranged at the back stage of the electron beam detection device 107. In the electron beam detection device 107 detection is made of the beam current, beam diameter and beam shape. When each of the above-mentioned three controlling quantities does not reach a predetermined value, the feedback quantities which correspond to the detected value of the three controlling quantities are fed back to the above-mentioned six controlling devices 101 to 106. In this controlling method, however, since the feedback loops are provided, for example, six in number as shown, operational interference may occur between each loop. Assume now that the brightness of a beam is found not to have reached a desired value as a result of having detected, for example, the beam current and beam diameter, by the electron beam detection device 107. The brightness of a beam is given as in the following equation (1) from the diameter and current of the beam.

$$B = AI/d^2 \quad (1)$$

where I represents the beam current, d the beam diameter, and A a coefficient peculiar to this type of electron beam system. The brightness B of a beam is determined in accordance with the operational state of the electron gun 101, for example, the heating current of a cathode of the electron gun and/or the bias voltage applied to a Wehnelt electrode thereof. Accordingly, the beam brightness is controlled by controlling the electron gun 101 in accordance with the quantities detected by the electron beam detection device 107. However, when the operation state of the electron gun 101 is varied, the state of the electron beam such as the current, diameter and shape thereof is varied. For this reason, in order to measure the reset values of the beam current and beam diameter by means of the detection device 107 it is necessary to adjust the electron gun 101, axis-alignment device 102, lens axis-alignment device 104, astigmatism correction lens 105 and objective lens 106, respectively, so that they are brought to optimum states. However, for the reason that the feedback loops are provided large in number as shown it takes a long time to obtain desired values of the controlling quantities such as the beam diameter and beam shape. Further, at the current level of technique, the measuring precision of the beam diameter and the reproducibility of the measured values are respectively 0.1 μm. Therefore, the total precision is approximately 0.2 μm. The degree of beam circle is approximately 0.1 μm in terms of the total precision. Accordingly, the percentage error in measuring the brightness of a circular beam of 0.5 μm diameter frequently becomes as great a value as over 100% in consideration of the reproducibility of that brightness. Controlling by the same or common controlling means both the beam current and the beam diameter together as in the case of the conventional electron beam system results in a decrease in the measuring precision of the brightness down to a value less than mentioned above. Such controlling, therefore, almost fails to obtain the desired brightness of a beam.

SUMMARY OF THE INVENTION

Accordingly, the object of the invention is to provide an electron beam system which is so designed that it can make a quick and precise control of electron beams by independently controlling an electron beam source section and an image formation section.

The electron beams system of the invention comprises an electron source section and an image formation section for causing an electron beam from the electron source section to be irradiated onto a subject to be irradiated.

The electron source section includes a first detecting means for detecting at least one of first controlling quantities for controlling the shape, diameter, brightness and spacial position of a crossover image and the direction of emission of the electron beam emitted from the crossover image, and a first control means having an electron gun means and an electron lens means each of which is controlled by the first controlling quantities. The electron lens means is for forming from an electron beam emitted from the electron gun means the crossover image used as an electron source of the image formation section and the first control means controls at least one of the first controlling quantities by a detection signal from the first detecting means. The image formation section includes a second detecting means for detecting at least one of second controlling quantities for controlling the shape and size of an electron beam image which is formed on the subject to be irradiated by using the crossover image as the electron source and the current for forming the electron beam image, and a second control means for controlling at least one of the second controlling quantities by a detection signal obtained by the second detecting means.

DETAILED DESCRIPTION OF THE PREFERRED EMBODIMENT

Figure 2:
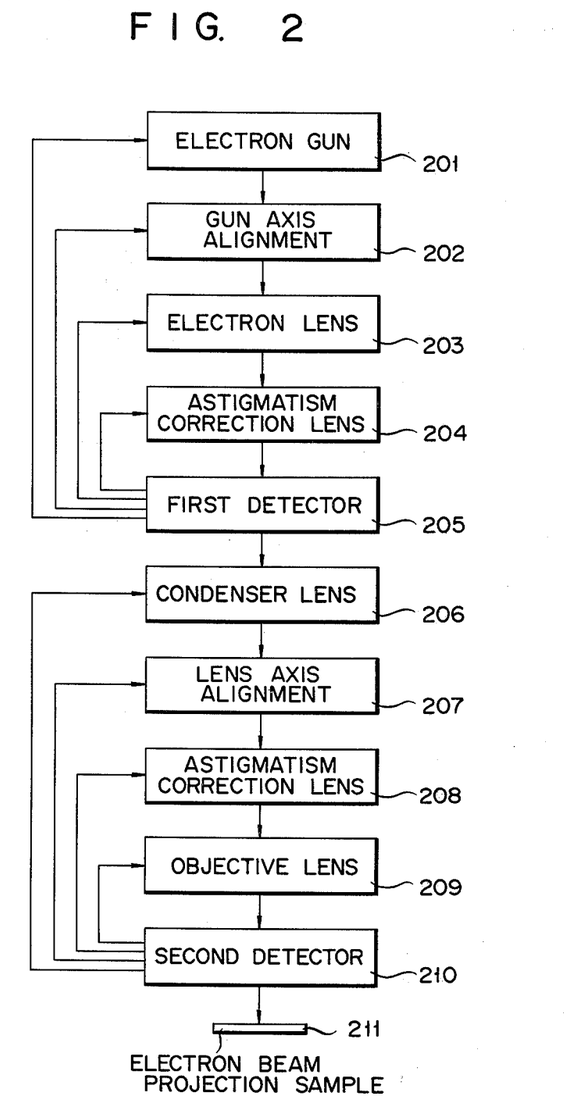
FIG. 2 is a block diagram for explaining the fundamental principle of the invention.

Referring to FIG. 2, numeral 201 denotes an electron gun, numeral 202 an axis-alignment device for the electron gun 201, numeral 203 an electron lens for controlling the position toward Z direction of the crossover which is formed by the beams from the electron gun 201, numeral 204 an astigmatism correction lens for correcting the astigmatism of the beams, and numeral 205 a first detecting device. The quantity which has been detected by the first detecting device 205 is fed back to each of the devices 201 to 204 which are each controlled in accordance with the quantity fed back thereto. Here in this specification the devices 201 to 205 are referred to collectively as an electron beam source section, the devices 201 to 204 collectively as a first control means, and the device 205 as a first detecting means. Numeral 206 denotes a condenser lens for controlling the beam which has passed through the first detector device 205. Numeral 207 denotes a lens axis-alignment device. Numeral 208 denotes an astigmatism correction lens for correcting the astigmatism of the beams. Numeral 209 denotes an objective lens and numeral 210 a second detecting device. Here in this specification the devices 206 to 210 are referred to collectively as an image formation section, the devices 206 to 209 collectively as a second control means, and the device 210 as a second detecting means. Numeral 211 is a sample onto which electron beams are irradiated.

In the electron source section, control is made of the brightness of a crossover image used as an electron beam source for the image formation section, the three-dimensional spatial position of such crossover image and the direction of the beam current emitted from the crossover image. When the electron lens 203 has a magnification of approximately 1, the crossover image (an electron source for the image formation section) which is formed in the proximity of the first detecting device 205 has a diameter of 10 to 30 $\mu m\phi$. Since the error in measuring the beam diameter inclusive of the error in reproducing the measured diameter is to an extent of 0.2 $\mu m$ at most, the error made in measuring the beam brightness becomes approximately 4% at most from the above-mentioned equation (1). Accordingly, precise measurement can be made of the beam brightness. Since in this embodiment the feedback loops are small in number, operational interference between the feedback loops occurs only to a very small extent, whereby quick control can be made of the beam brightness. When the cathode heating current of the electron gun 201 is small or when the bias voltage of a Wehnelt electrode is low in level, a hollow beam or plural beams are generated from the electron gun 201. Generation of such beam or beams is not preferable. Generation of such plural beams is described in detail in "Optimization of Performance of High Brightness Electron Gun" in J. Vac. Sci. Technology, 10, 972, 1973. The shape of the beams is detected by the first detecting device 205 and the quantity detected is fed back to the devices 201 to 204.

The controlling quantities in the image formation section are beam current, beam shape and the position of a focal beam point. As will be apparent from the above-mentioned equation (1) when the beam brightness B is given, namely is already determined, the beam diameter d is determined by the beam current I. Since in this invention the brightness of the beams is previously measured in the electron source section, in the image formation section it is not necessary to control or measure the diameter of the beams. Further, since the three-dimensional spatial position of the crossover image and the direction of the beam current ejected from the crossover image are previously controlled or measured in the electron source section, operational interference between the electron source section and the image formation section occurs only in respect of beam current. When control is made of the condenser lens 206, change can be made of the beam current under the condition in which the brightness is fixed. However, since the control of the condenser lens 206 causes a change in the position of a focal beam point, the direction of the optical axis and the greatness of the astigmatism, it becomes necessary to reset the optimum state of each of the lens axis-alignment device 207, astigmatism correction lens 208 and objective lens 209. In the electron beam system which is constructed as shown in FIG. 2 which one of the devices in the electron source section and image formation section should be controlled may be determined in accordance with a necessary exposure system. For instance, the object in the electron source section which is to be controlled can be limited only to the brightness only.

As mentioned above, by separately controlling the electron source section and the image formation section the operational doubling in the feedback loop for controlling the beam, i.e., the operational interference between the loops decreases, so that it is possible to measure the beam brightness with high precision and also so that quick and precise control can be made of the devices involved in the electron source section and image formation section.

Figure 3:
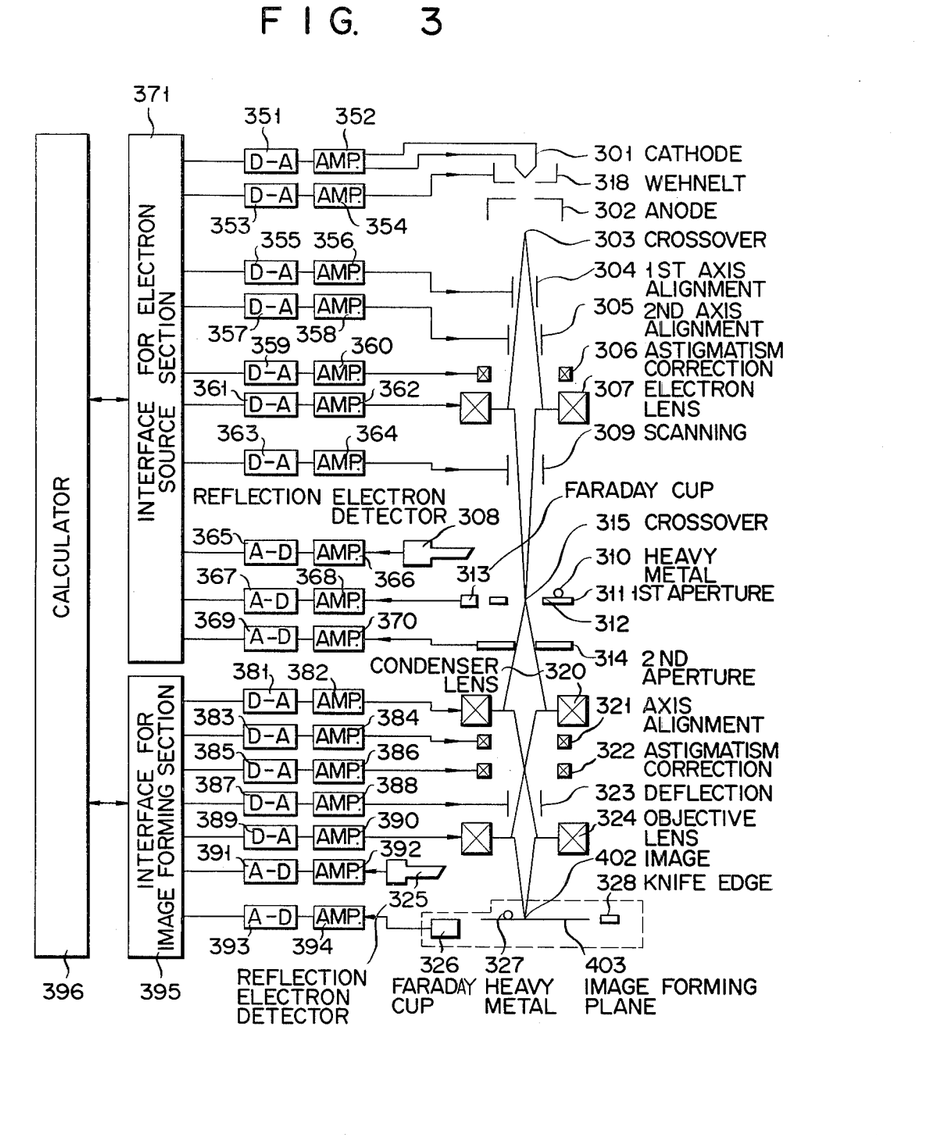
FIG. 3 is a view showing an embodiment of the invention.

We will now explain an embodiment of the invention by reference to FIG. 3. In FIG. 3, a cathode 301, Wehnelt electrode 318 and anode 302 constituted the electron gun. This electron gun forms a gun crossover 303. Numeral 304 denotes a first axis-alignment device for the electron gun, 305 a second axis-alignment device for the electron gun, 306 an astigmatism correction lens for correcting the astigmatism of the beams, and 307 an electron lens for forming a crossover 315 used as an electron source for the image formation section. Numeral 309 denotes a beam scanning device. The gun and the devices 304 to 309 are hardware elements which constitute the first control means of the electron source section. Numeral 311 denotes a first rectangular aperture for axis-alignment of the beam, numeral 314 a second rectangular aperture for axis-alignment of the beam, and 310 a heavy metal minute particle, for example, a minute particle of tungsten carbide, which has a particle size of approximately 1 $\mu m\phi$ and which is provided on one side 312 of the rectangular aperture 311. Numeral 313 denotes a Farady cup and 308 a reflection electron detector. The said members 310, 311, 312 and 314 and the devices 308 and 313 constitute the first detecting means of the electron source section. Numeral 351, 352 denote a D-A converter and an amplifier for controlling the heating current of the cathode of the electron gun respectively, numerals 353, 354 a D-A converter and an amplifier for controlling the bias voltage across the cathode 301 and Wehnelt electrode 318 respectively, numerals 355, 356 a D-A converter and an amplifier for controlling the first axis-alignment device 304 of the electron gun respectively, numerals 357, 358 a D-A converter and an amplifier for controlling the second axis-alignment device 305 of the electron gun respectively, numerals 359, 360 a D-A converter and an amplifier for controlling the astigmatism correction lens 306 respectively, numerals 361, 362 a D-A converter and an amplifier for controlling the electron lens 307 respectively, and numerals 363, 364 a D-A converter and an amplifier for controlling the scanning device 309 respectively. The above-mentioned D-A converters and amplifiers, which are connected to an interface 371 coupled to a calculator 396, constitute an electric circuit of the first control means for the electron source section, together with the calculator 396 and interface 371.

Numerals 366, 365 denote an amplifier of the output of the reflection electron detector 308 and an A-D converter for converting the output of the amplifier 366 into a digital amount, respectively, numerals 368, 367 an amplifier of the output of the Faraday cup 313 and an A-D converter for converting the output of the amplifier 368 into a digital amount respectively, and numerals 370, 369 an amplifier for amplifying the absorbed current of the second aperture 314 and an A-D converter for converting the output of the amplifier 370 into a digital amount. The above-mentioned amplifiers 366, 368 and 370 and A-D converters 365, 367 and 369 constitute an electric circuit of the first detecting means for the electron source section, together with the calculator 396, interface 371, reflection electron detector 308 and Faraday cup 313.

Numeral 320 denotes a condenser lens for causing the crossover image 315 to be projected onto an image forming plane 403, numeral 321 an axis-alignment device for the condenser lens 320, numeral 322 an astigmatism correction lens for the condenser lens 320, numeral 323 a beam deflection device, and numeral 324 an objective lens. The devices 320 to 324 constitute a hardware section of the second control means for the image formation section. On the image forming plane 403 there are disposed a knife edge 328, a heavy metal minute particle 327 and a Faraday cup 326. Above the image forming plane there is disposed a reflection electron detector 325. The elements or devices 327, 328, 403 and 326 are made integrally movable. Numerals 381, 382 denote a D-A converter and an amplifier for controlling the condenser lens 320 respectively, numerals 383, 384 a D-A converter and an amplifier for controlling the axis-alignment device, respectively, numerals 385, 386 a D-A converter and an amplifier for controlling the astigmatism correction lens 322 respectively, numerals 387, 388 a D-A converter and an amplifier for controlling the deflection device 323 respectively, and numerals 389, 390 a D-A converter and an amplifier for controlling the objective lens 324, respectively. The D-A converters 381, 383, 385, 387 and 389 and the amplifiers 382, 384, 386, 388 and 390 constitute an electric circuit of the second control means, together with the calculator 396 and interface 395. Numerals 392, 391 denote an amplifier for amplifying the output of the reflection electron detector 325 and an A-D converter for converting the output of the amplifier 392 into a digital amount, respectively, and numerals 394, 393 an amplifier for amplifying the output of the Faraday cup 326 and an A-D converter for converting the output of the amplifier 394 into a digital amount, respectively. The A-D converters 391, 393, amplifiers 392, 394, reflection electron detector 325 and Faraday cup 326 constitute an electric circuit of the second control means, together with the calculator 396 and interface 395.

Explanation will now be made of the operation of the electron beam system shown in FIG. 3. The crossover image 315 of the crossover 303 which is formed by the electron gun is formed, by means of the electron lens 307 and with a magnification of about 1, at the position of the first rectangular aperture 311. The focussing of the electron lens 307 on the plane of the aperture 311 is performed by subjecting one side 312 of this aperture to electron beam scanning by the scanning device 309 and controlling the system by the first control means so that the reflection electron signal (which is detected by the reflection electron detector 308) from said one side of the aperture 311 has a minimum rise. Upon completion of the focussing, the configuration of the beam (for example, the degree of beam circle, etc.) is analyzed by the calculator 396 and, in accordance with the result of this analysis, is corrected via the first control means, so as to become a desired configuration. Namely, the configuration of the beam is judged by, when the heavy metal minute particle 310 is subjected to electron scanning, detecting the electron reflected from that minute particle 310 by means of the reflection electron detector 308 and analyzing the detected result by the calculator 396. Note here that the method of monitoring the configuration of the electron beam by the use of the heavy metal minute particle 310 is known (see "MICRO CIRCUIT ENGINEERING" page 20, published on a day from the 11th to the 13th Apr. 1978). When it has been found that the electron beam is a hollow beam or consists of plural beams, the temperature of the cathode 301 is elevated via the D-A converter 351 and then via the amplifier 352, or the bias voltage of the Wehnelt electrode 318 is increased via the D-A converter 353 and then via the amplifier 354, or each of the cathode 301 and Wehnelt electrode 318 is controlled. When it has been found that the electron beam is elliptical, the astigmatism correction lens 306 is controlled via the D-A converter 359 and then via the amplifier 360 to eliminate the astigmatism thus to make the beam exactly circular. After correction of the beam configuration to such circular one, by using as a knife edge said one side 312 of the rectangular aperture 311 this knife edge is subjected by the scanning device to beam scanning and the electron reflected from the aperture 311 is detected by the reflection electron detector 308. Thus, the beam diameter is determined by the calculator 396 from the result above detected. Beam-scanning of the knife edge to determine the beam diameter is known as a knife edge method (see "PROCEEDING OF THE EIGHT ANNUAL SCANNING ELECTRON MICROSCOPY SYMPOSIUM" 1975 pages 19 to 25). Since the diameter of the beam on the plane of the rectangular aperture 311 is in the range of 10 to 30 $\mu m\phi$, the error of approximately 0.2 $\mu m$ made in measuring the beam diameter causes only a making of an error of approximately 4% at most in determining the brightness in accordance with the above-mentioned equation (1). In the above-mentioned manner, the diameter of the crossover image 315 on the plane of the aperture 311 and the current of the beam are measured and determined and from this measured values the brightness of the beam is determined with high precision. Since the beam brightness is a function of the temperature of the cathode 301 and the bias voltage of the Wehnelt electrode, the amount of error as measured relative to the desired value of the brightness is fed back to the electron gun via the first control means thus to control the same.

The position of the crossover image 315 which is located in the direction of the optical axis, i.e., z direction is controlled by controlling the electron lens 307 to form an image of the crossover image 315 on the plane of the rectangular aperture 311. Where some change has occurred in the z-directional position of the crossover 303 due, for example, to replacement of the electron gun, if the image of the crossover 303 is formed on the plane of the aperture 311 by being focussed on the same as stated before, the z-directional position of the crossover image 315 is determined on the rectangular aperture 311.

The position of the crossover image 315 which is located on the plane (x-y) is controlled in the following manner. First, the upper face of the plane of the rectangular aperture 311 is subjected by using the first axis-alignment device 304 of the electron gun to electron beam scanning in the directions x and y. Then, the reflection electron which is produced due to the interaction between the one side 312 of the rectangular aperture and the scanning electron beam is detected by the reflection electron detector 308, and the position of the four sides of the aperture 311 relative to the crossover image 315 is determined by the calculator 396. The center of the rectangular aperture 311 is determined, by the calculator 396, from the position of the four sides of the rectangular aperture 311, and the first axis-alignment device 304 of the electron gun is so controlled via the D-A converter 355 and then via the amplifier 356 as to permit the center of the crossover image 315 to be in coincidence with the center of the rectangular aperture 311. Since the crossover image 315 has a high density of electron beams, when the crossover image 315 is kept focussed on the rectangular aperture 311 for a long time, the aperture 311 is dissolved or deformed. Accordingly, the rectangular aperture 311 should be so designed as to have a size larger than that of the crossover image 315 and, except for the case of detecting the position of the crossover image 315 in the directions x and y, arrangement should be so made that there occurs no interaction (beam scanning) between the crossover image 315 and the aperture 311.

The angle of emission of the electron beams from the crossover image 315 is controlled by controlling the second axis-alignment device 305 of the electron gun so as to permit the absorbed current of the second aperture 314 to become minimum. The electron beam is diffused in the proximity of the second aperture 314 and is therefore low in electron beam density. Accordingly, the aperture 314 may be of a structure wherein it is always kept given the electron beams. Since mutual interference occurs between the controlling operation for the position of the crossover image 315 located on the plane (x-y) and the controlling operation for the angle of emission of the electron beams from the crossover image 315, the first and second axis-alignment devices 304 and 305 of the electron gun should be alternatingly controlled repetitively.

Thus, in the electron beam source section, control is made of the brightness of the crossover image 315, the position of the crossover image 315, the advancing direction of the electron beam emitted from the crossover image 315 and the configuration of the crossover image 315. In addition, in the calculator the diameter of the crossover image 315 is stored.

Next, explanation will hereinbelow be made of the action of the image formation section. Here is it necessary to note that the electron beam source of the image formation section is the crossover image 315. As explained in connection with the electron beam source section, the brightness and position of the crossover image 315 and the direction of emission of the electron beam and the configuration thereof are controlled to desired values, respectively. Accordingly, it is not necessary that the image formation section has a complicated controlling mechanism required because of indefinite crossover image 315. Namely, it is sufficient that the image formation section is controlled as follows. It should be noted here that the crossover image 315 is formed, as the electron image 402, on the image forming plane 403 (for example, a sample plane) and that on the image forming plane 403 there are disposed the knife edge 328, heavy metal minute particle 327 and Faraday cup 326, which are made integrally movable. First, the beam is deflected by the deflection device 323 and the beam current is detected by the Faraday cup 326. In this case, the lens axis-alignment device 321 is so controlled as to permit the beam current to become maximum. When the beam current fails to reach a desired value, the condenser lens 320 is so controlled as to permit the beam current to reach such desired value. When the condenser lens 320 is controlled, the state of the beam changes with a result that the axis-alignment of the lens 320 becomes again necessary. Next, the knife edge 328 is subjected to electron beam scanning, and the reflection electron beam produced due to the interaction between the knife edge 328 and the scanning electron beam is detected by the reflection electron detector 325, and the objective lens 324 is brought, by being controlled in correspondence to the reflection electron beam signal, to a state of front focussing or back focussing. For example, in the state of front focussing the configuration of the beam is detected by the heavy metal minute particle (for example, a tungsten carbide particle of $0.1 \mu m \phi$ is suitable as such heavy metal minute particle) via the reflection electron detector 325. Then, the astigmatism correction lens 322 is so controlled as to permit the beam configuration to become a circular one. After completion of the astigmatism correction, the reflection electron beam from the knife edge 328 is detected by the reflection electron detector 325 and then the objective lens 324 is so controlled as to permit the output of that detector 325, i.e., the reflection electron beam signal to have a minimum rise, thereby to cause the electron image 402 to be formed on the image forming plane 403, i.e., cause the electron image 402 to be focussed thereon. At this time of focussing, detection is made of the beam diameter via the Faraday cup 326 but no control is made of it. The reason for this is that since in the electron source section the brightness of the beam is already controlled, the beam diameter is determined from the equation (1) if only control is made of the beam current.

A control coil for correcting the beam radiation direction may be provided between the first aperture 311 and the second aperture 314. Further, a coil for aligning the optical axis of the condenser lens 320 may be provided between the second aperture 314 and the condenser lens 320. The beam radiation direction is set in an easier manner by controlling the control coil. The axis alignment of the condenser lens 320 is effected in an easier manner by controlling the axis alignment coil.

The effect of the embodiment shown in FIG. 3 can be summarized as follows. Namely, in the prior art electron beam system determination is first made of the beam diameter ranging from 0.3 to 1 μmφ in the above-mentioned manner and then determination is made of the brightness of the crossover image from the measured result. Since, however, the measurement and reproduction of such small beam diameter are followed by the error of approximately 0.1 μm, the percentage error in detecting the brightness inclusive of that in reproducing the same is very high, as much as 40 to 120%. Additionally, as apparent from FIG. 1, too many feedback loops are involved for a single detecting means, so that about ten minutes is required for determination of the beam brightness. In contrast, according to the electron beam system of the invention, in the electron source section measurement is made of the diameter of the crossover image 315 ranging from 10 to 30 μmφ and determination is made of the beam brightness from the measured result. For this reason, the percentage error of detection of the beam brightness can be reduced and becomes about 4% at most. Further, the electron source section includes a reduced number of the feedback loops whereby the extent to which mutual interference between the loops occurs becomes small. As a result, the time period required for determination of the brightness can be shortened to one minute or less. Further, in the conventional electron beam system the position of the electron source, the direction of emission of the electron beam from the electron source, and the shape of the electron beam are made indefinite or are not readily determined, so that the control of the electron beam system as a whole is made in a complicated manner and is virtually difficult. In contrast, according to the invention, the electron beam system is divided into two sections, the electron source section and the image formation section, in each of which the controlling quantity is detected and the controlling means is controlled in accordance with the result thus detected. Therefore, control can be easily made of the electron beam system as a whole. Such a system structure as mentioned above is most suitable to, for example, an electron beam exposure device which high precision and high reliability are demanded from.

Figure 4:
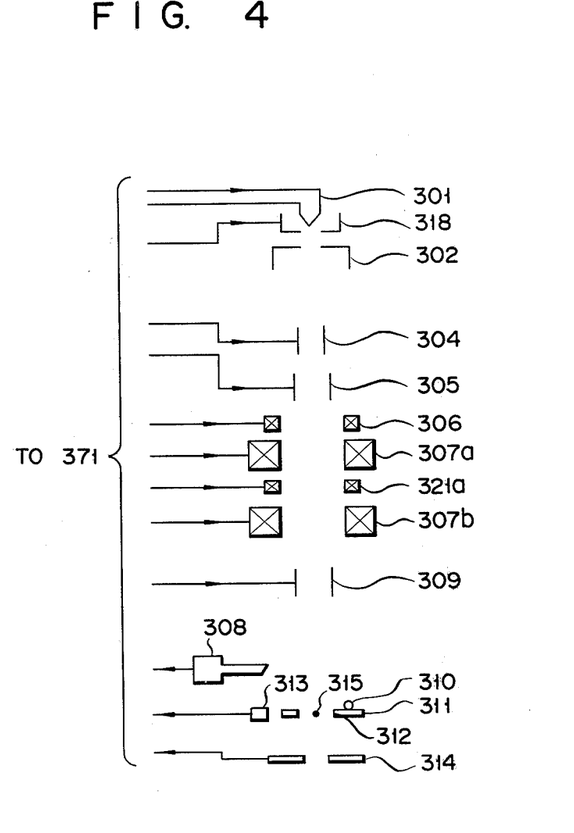
FIG. 4 is a view showing a modification of an electron beam source section of the invention.

There will now be described a first modification of the electron source section by reference to FIG. 4. In FIG. 4, the disposition, on the optical axis, of the electron gun, first axis-alignment device 304, second axis-alignment device 305, astigmatism correction lens 306, scanning device 309, and rectangular apertures 311, 314 and the disposition of the heavy metal minute particle 310, reflection electron detector 308 and Faraday cup 313 are the same as in the embodiment shown in FIG. 1. Therefore, they are denoted by like numerals and explanation of them is omitted. In this modification, between the astigmatism correction lens 306 and the scanning device 309 there are arranged the first electron lens 307a, axis-alignment device 321a for it and second electron lens 307b in the order mentioned. In this modification control can be made, by such two electron lens, of the position, in the z direction, of the crossover 315 and the diameter thereof.

Figure 5:
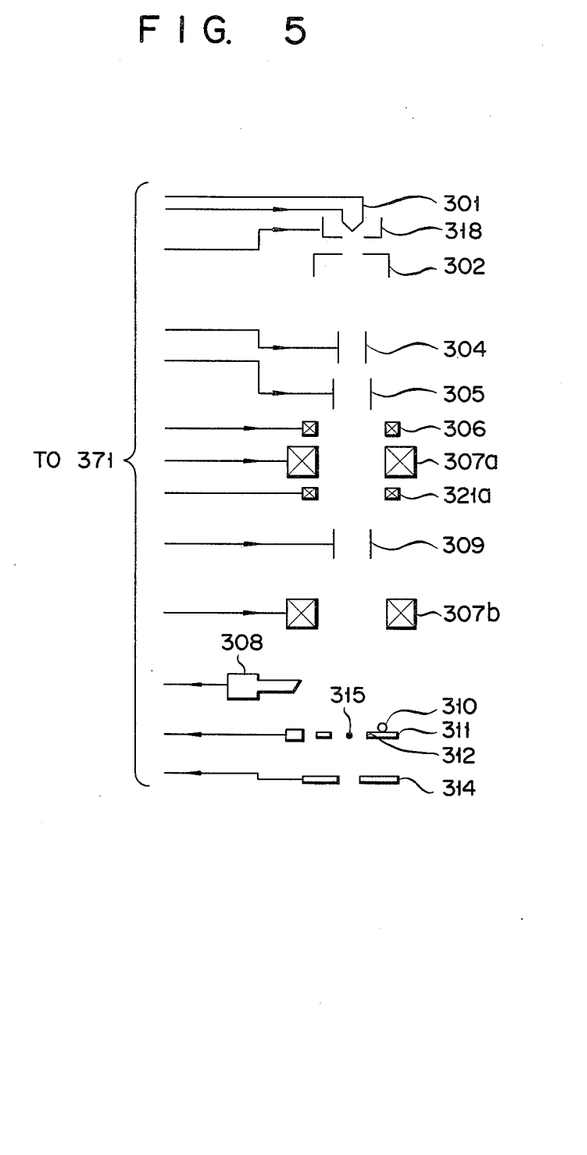
FIG. 5 is a view showing another modification of the electron beam source section of the invention.

In FIG. 5 there is shown a second modification of the electron source section. Between the astigmatism correction lens 306 and the first rectangular aperture 311 there are arranged the first electron lens 307a, axis-alignment device 321a therefor, scanning device 309 and second electron lens 307b in the order mentioned. The action and effect of this modification are the same as those of the first modification shown in FIG. 4.

Figure 6:
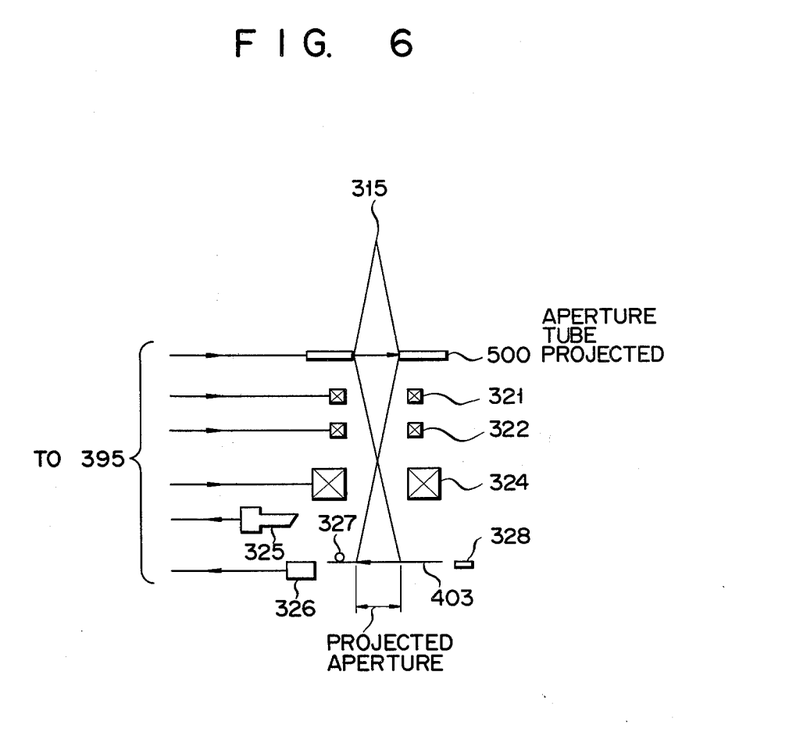
FIG. 6 is a view showing a modification of an image formation section of the invention.

In recent years, there has been developed an electron beam exposure system of the type wherein an aperture image is projected to a sample. This type of system, effectively, is also divided into an electron source section and an image formation section to control the crossover image. The reason why such type of system is also effective is that the quantities regulating the crossover image such as, for example, the brightness, diameter, and direction of emission of the electron beam are the basic quantities for any electron beam exposure system. In said type of system the image formation section has the construction shown in FIG. 6. In FIG. 6, at the back stage of the crossover image 315 there are arranged an aperture 500 which is to be projected on an image forming plane 403, axis-alignment device 321, astigmatism correction lens 322, objective lens 324 and image forming plane 403 in the order mentioned. The disposition of the knife edge 308, heavy metal minute particle 327, Faraday cup 326 and reflection detector 325 is the same as that of such devices in the embodiment shown in FIG. 1.

Further, in FIG. 3, two apertures, instead of the second aperture 314, are disposed in the advancing direction of the beam and a beam deflection means is provided between such two apertures, thereby to change the cross-sectional configuration of the beam.

I claim:

1. An electron beam system comprising an electron source section and an image formation section for causing an electron beam from said electron source section to be irradiated onto a subject to be irradiated, said electron source section and said image formation section being arranged so as to be mechanically and optically independent of each other, said electron source section including:
a first detecting means for detecting at least one of first controlling quantities for controlling the shape, diameter, brightness and spatial position of a crossover image and the direction of emission of the electron beam emitted from said crossover image; and
a first control means having an electron gun means and an electron lens means each of which is controlled by said first controlling quantities, said electron lens means being for forming from an electron beam emitted from said electron gun means said crossover image used as an electron source of said image formation section, said first control means controlling at least one of said first controlling quantities by a detection signal from said first detecting means, said image formation section including:
a second detecting means for detecting at least one of second controlling quantities for controlling the shape and size of an electron beam image which is formed on said subject to be irradiated by using said crossover image as said electron source and the current of an electron beam for forming said electron beam image; and
a second control means for controlling at least one of said second controlling quantities by a detection signal obtained by said second detecting means.

2. An electron beam system according to claim 1, wherein said first detection means and said first control means are coupled by a plurality of first feedback loops and said second detecting means and said second control means are coupled by a plurality of second feedback loops, each feedback loop of said first and second feedback loops including an amplifier for amplifying a controlling quantity detected, an A-D converter for converting the output of said amplifier to a digital quantity, a calculator for processing said digital quantity, a D-A converter for converting the output of said calculator into an analog quantity and an amplifier for amplifying the analog quantity to supply it to a corresponding device to be controlled.

3. An electron beam system according to claim 1, wherein said first control means includes an electron gun, a first axis-alignment device for said electron gun, a second axis-alignment device for said electron gun, an astigmatism correction lens, an electron lens for forming said crossover image used as said electron source and a beam scanning device, in the form of being arranged in the order mentioned; and said first detecting means includes a first aperture for detecting the shape, diameter, brightness and spatial position of said crossover image and a second aperture for detecting the current of said electron beam, said first and second apertures being arranged in the order mentioned at the back stage of said scanning device.

4. An electron beam system according to claim 1, wherein said first control means includes an electron gun, a first axis-alignment device for said electron gun, a second axis-alignment device for said electron gun, an astigmatism correction lens, a first electron lens for forming said crossover image used as said electron source, an axis-alignment device for said first electron lens, a second electron lens for forming said crossover image and a scanning device, in the form of being arranged in the order mentioned; and said first detecting means includes a first aperture for detecting the shape, diameter, brightness and spatial position of said crossover image and a second aperture for detecting the current of said electron beam, said first and second apertures being arranged in the order mentioned at the back stage of said scanning device.

5. An electron beam system according to claim 1, wherein said first control means includes an electron gun, a first axis-alignment device for said electron gun, a second axis-alignment device for said electron gun, an astigmatism correction lens, a first electron lens for forming said crossover image used as said electron source, an axis-alignment device for said first electron lens, a scanning device and a second electron lens for forming said crossover image, in the form of being arranged in the order mentioned; and said first detecting means includes a first aperture for detecting the shape, diameter, brightness and spatial position of said crossover image and a second aperture for detecting the current of said electron beam, said first and second apertures being arranged in the order mentioned at the back stage of said scanning device.

6. An electron beam system according to claim 1, wherein said second control means includes a condenser lens for forming on an image forming plane the electron image of that crossover image used as said electron source which is formed by said electron source section, an axis-alignment device for said condenser lens, an astigmatism correction lens, a beam deflection device and an objective lens; and said second detecting means includes a knife edge, heavy metal minute particle and a reflection electron detector for detecting the shape and size of an electron image formed on said image forming plane, and a Faraday cup for detecting the current of an electron beam forming said electron image.

7. An electron beam system according to claim 1, wherein said second control means includes a projecting aperture irradiated by beams from that crossover image used as said electron source which is formed by said electron source section, an axis-alignment device, an astigmatism correction lens, and an objective lens; and said second detecting means includes a knife edge, heavy metal minute particle and reflection electron detector for detecting the shape and size of an image of said projecting aperture formed on an image forming plane, and a Faraday cup for detecting the current of an electron beam forming an image of said projecting aperture.

* * * * *